(12) United States Patent
Ban

(10) Patent No.: US 7,923,329 B2
(45) Date of Patent: Apr. 12, 2011

(54) METHOD FOR MANUFACTURING A SEMICONDUCTOR DEVICE

(75) Inventor: Keun Do Ban, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/147,135

(22) Filed: Jun. 26, 2008

(65) Prior Publication Data

US 2009/0170275 A1 Jul. 2, 2009

(30) Foreign Application Priority Data

Dec. 31, 2007 (KR) .................. 10-2007-0141512

(51) Int. Cl.
*H01L 21/336* (2006.01)
*H01L 29/94* (2006.01)
*H01L 21/70* (2006.01)
*H01L 29/78* (2006.01)

(52) U.S. Cl. .................. 438/268; 257/E21.41; 257/302; 257/329; 257/334; 257/330

(58) Field of Classification Search .................. 257/262, 257/302, 329, E21.41, E29.262; 438/268
See application file for complete search history.

(56) References Cited

U.S. PATENT DOCUMENTS

| 5,756,237 | A | * | 5/1998 | Amemiya .................... 430/5 |
| 6,107,133 | A | | 8/2000 | Furukawa et al. |
| 7,348,628 | B2 | | 3/2008 | Yoon et al. |
| 2003/0169629 | A1 | | 9/2003 | Goebel et al. |
| 2005/0014667 | A1 | * | 1/2005 | Aoyama et al. ............... 510/175 |
| 2008/0213544 | A1 | * | 9/2008 | Devadoss et al. ............ 428/173 |
| 2008/0292995 | A1 | * | 11/2008 | Houlihan et al. ............. 430/322 |

FOREIGN PATENT DOCUMENTS

| CN | 1230026 A | 9/1999 |
| EP | 0 948 053 A2 | 10/1999 |
| KR | 10-0734313 | 6/2007 |
| KR | 10-2007-0109651 | 11/2007 |

* cited by examiner

*Primary Examiner* — Andy Huynh
*Assistant Examiner* — Aaron A Dehne
(74) *Attorney, Agent, or Firm* — Marshall, Gerstein & Borun LLP

(57) ABSTRACT

A method for manufacturing a semiconductor device includes forming a spin-on-carbon (SOC) film that facilitates a low temperature baking process, can prevent collapse of vertical transistors while forming a bit line, thereby providing a more simple manufacturing method and improving manufacturing yields.

13 Claims, 7 Drawing Sheets

METHOD FOR MANUFACTURING A SEMICONDUCTOR DEVICE

CROSS-REFERENCE TO RELATED APPLICATION

The priority of Korean patent application No. 10-2007-0141512 filed Dec. 31, 2007, the entire disclosure of which is incorporated by reference in its entirety, is claimed.

BACKGROUND OF THE INVENTION

1. Field of the Invention

The invention generally relates to a method for manufacturing a semiconductor device, and more specifically, to a method for manufacturing a semiconductor device that includes forming a spin-on-carbon (SOC) film.

2. Brief Description of Related Technology

Semiconductor devices, such as dynamic random access memory (DRAM) devices include more transistors in a limited region to improve integration of the devices. A vertical transistor technology of including memory cells in a small area has been suggested to further improve integration.

In a memory device, a vertical transistor has a gate structure that surrounds a vertical channel. In order to form a surrounding gate, a channel region is formed by a selective isotropic etching process to be thinner than a source/drain region, thereby obtaining an excellent device characteristic. As a result, the vertical transistor can use a limited area effectively. The vertical transistor has been spotlighted in various fields because it is expected to more easily form a smaller-sized transistor.

The vertical transistor may maintain a given channel length, even in reduced device areas and, therefore, may be an effective means to a short channel effect (SCE). Specifically, the surrounding gate structure can maximize controllability of the gate to improve the SCE as well as to provide an excellent operating current characteristic due to a large current flowing area. As a result, the vertical transistor is required to have a thinner and longer structure to improve the integration. However, when the surrounding gate of the vertical transistor is formed, an etching process for isolating a thin and deep bit line may not be formed due to a high aspect ratio.

FIGS. 1a to 1h are cross-sectional diagrams illustrating a conventional method for manufacturing a semiconductor device. Referring to FIG. 1a, a hard mask pattern 15 defining an active region is formed over a semiconductor substrate 10. The substrate 10 is etched with the hard mask pattern 15 as a mask to form a first pillar 20. A spacer 15a is formed at sidewalls of the first pillar 20 and the hard mask pattern 15. The substrate 10 is further dry etched using the hard mask pattern 15 and the spacer 15a to form a second pillar (not shown). A sidewall of the second pillar (not shown) is isotropic-etched to form a third pillar 25 for forming a surrounding gate. A first bit line implant region 40 is formed in the substrate 10 between the third pillars 25. A source/drain region is formed in top and bottom portions of the third pillar 25. A gate oxide film (not shown) and a gate polysilicon layer 30 are formed at sidewalls of the third pillar 25 to obtain a surrounding gate to complete a vertical transistor 50.

Referring to FIG. 1b, a first SOD film 60 is formed over the semiconductor substrate 10, including the vertical transistor 50. The substrate 10 including the first SOD film 60 is annealed at 600° C. The annealing process imparts a rough surface to the first SOD film 60. A chemical mechanical polishing (CMP) process is performed to remove the rough surface. An excessive stress is applied to the vertical transistor 50, which causes the vertical transistor 50 to collapse.

Referring to FIG. 1c, an amorphous carbon layer 65 and a SiON film 70 are sequentially formed over the semiconductor substrate 10, including the first SOD film 60. A photoresist film 75 is formed over the SiON film 70.

Referring to FIG. 1d, the photoresist film 75 is partially etched to form a photoresist pattern 75d, exposing a region between the vertical transistors 50.

Referring to FIG. 1e, the SiON film 70 and the amorphous carbon layer 65 are etched, using the photoresist pattern 75d as a mask, to form an amorphous carbon pattern 65d and a SiON pattern 70d. The amorphous carbon pattern 65d and the SiON pattern 70d are thereafter used as a hard mask pattern for forming a bit line isolating trench.

Referring to FIG. 1f, the first SOD film 60 and the substrate 10 under the first SOD film 60 are etched, using the SiON pattern 70d and the amorphous carbon pattern 65d as a mask, to form a bit line isolating trench 80. The first bit line implant region 40 is divided, which becomes a first bit line 40a. Thereafter, the SiON pattern 70d and the amorphous carbon pattern 65d are removed.

Referring to FIG. 1g, a second bit line implant process is performed on the bottom portion of the first bit line 40a to form a second bit line 85. As shown in FIG. 1h, a second SOD film 90 is filled in the bit line isolating trench 80 for a subsequent process.

As mentioned above, when a bit line is formed in a vertical transistor, the bit line is filled in the bottom of the transistor. As semiconductor devices become more highly integrated, the gap between vertical transistors becomes narrower, requiring use of a SOD film having an excellent gap fill characteristic as a sacrificial film for forming the bit line trench. The SOD film, however, requires an annealing process at a temperature greater than 600° C., and subsequent CMP to remove the surface left by the annealing process. While the SOD film is formed, an over-stress is applied to the vertical transistor, and the vertical transistor collapses under the stress. As a result, the yield of the semiconductor device is reduced, and an unnecessary process is performed.

BRIEF SUMMARY OF THE INVENTION

Disclosed herein is a method for manufacturing a semiconductor device. An embodiment of the method includes forming vertical transistors in a semiconductor substrate and forming a spin-on-carbon (SOC) film for filling a gap between the vertical transistors. The method also includes forming a hard mask pattern over the substrate, including over the vertical transistor and the SOC film. Furthermore, the method includes etching the SOC film, with the hard mask pattern as a mask, to expose the substrate disposed in a bottom portion of the SOC film, removing the hard mask pattern, etching the exposed substrate to form a bit line trench, and performing an implant process to form a bit line in a portion of the substrate where the bit line trench contacts the vertical transistors.

Additional features of the disclosed invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1A:
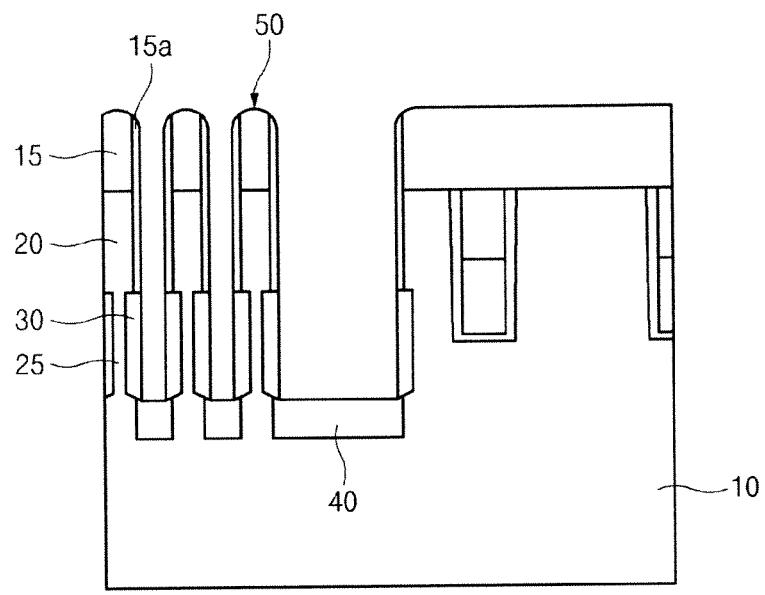
FIGS. 1a to 1h are cross-sectional diagrams illustrating a conventional method for manufacturing a semiconductor device; and, FIGS. 2a to 2f are cross-sectional diagrams illustrating a method for manufacturing a semiconductor device according to an embodiment of the disclosed invention.
Figure 1B:
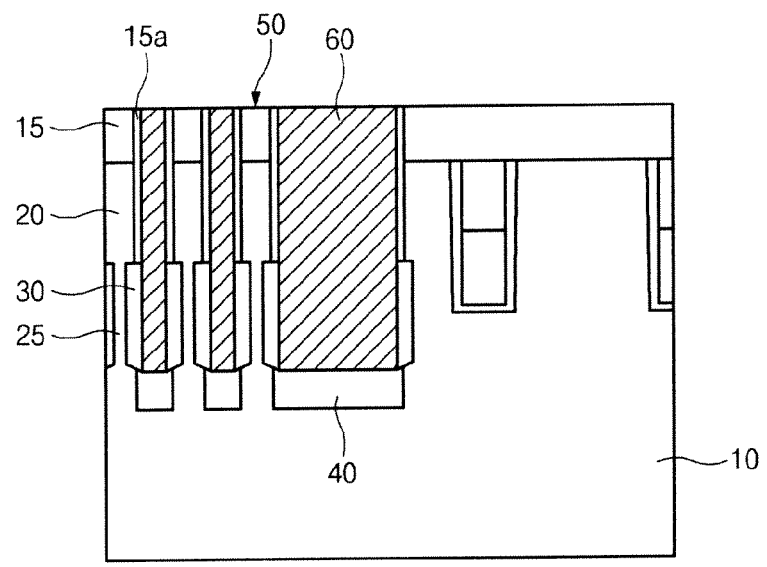
Figure 1C:
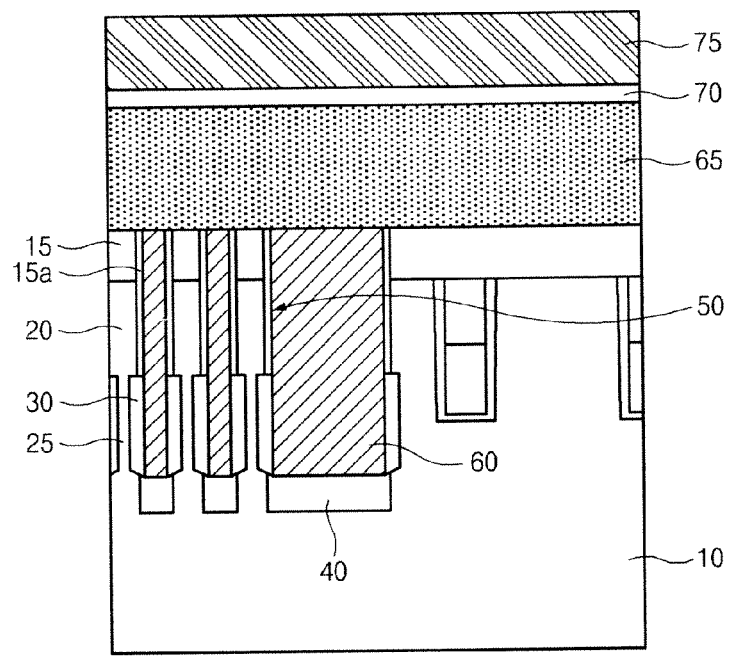
Figure 1D:
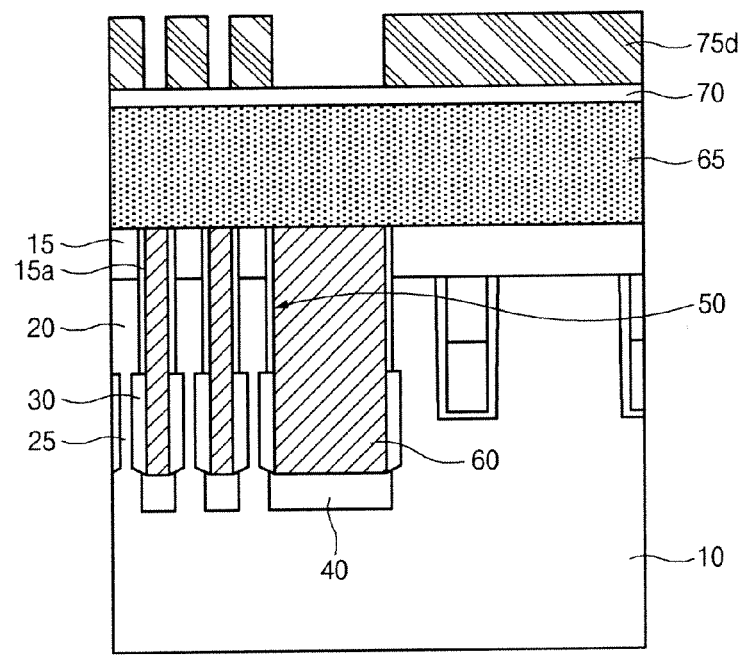
Figure 1E:
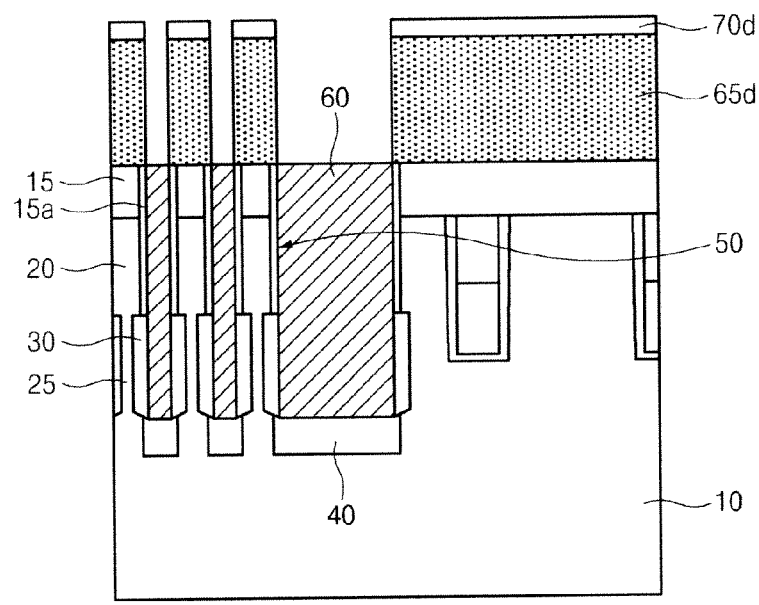
Figure 1F:
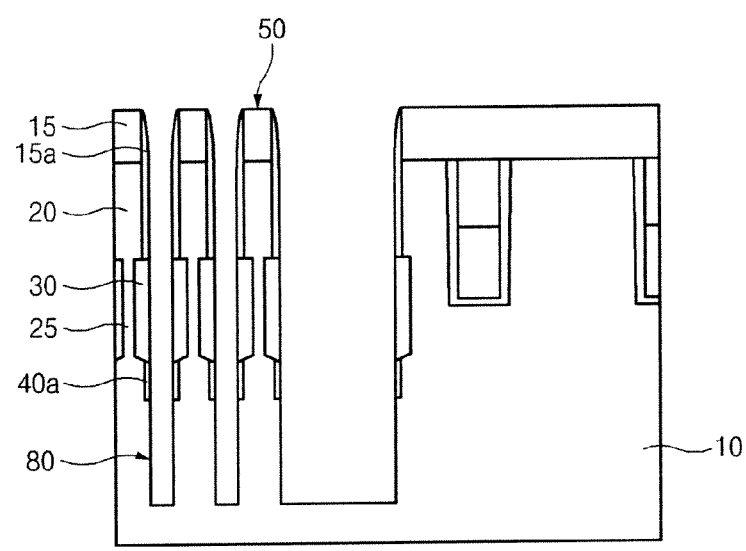
Figure 1G:
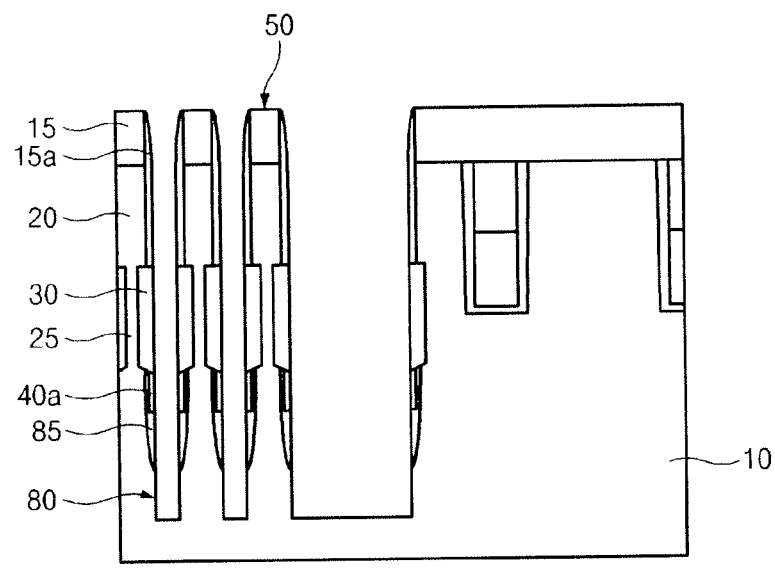
Figure 1H:
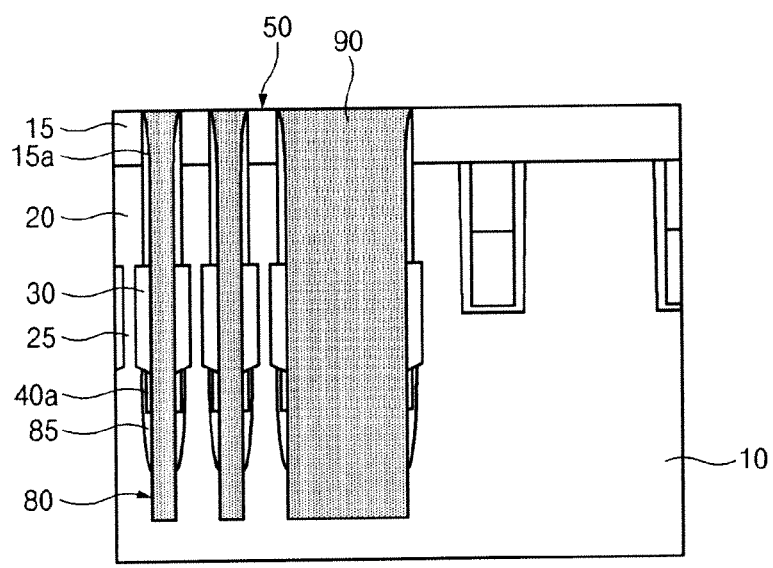

While the disclosed method is susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF THE PREFERRED EMBODIMENTS

FIGS. 2a to 2f are cross-sectional diagrams illustrating a method for manufacturing a semiconductor device according to an embodiment of the present invention.

Figure 2A:
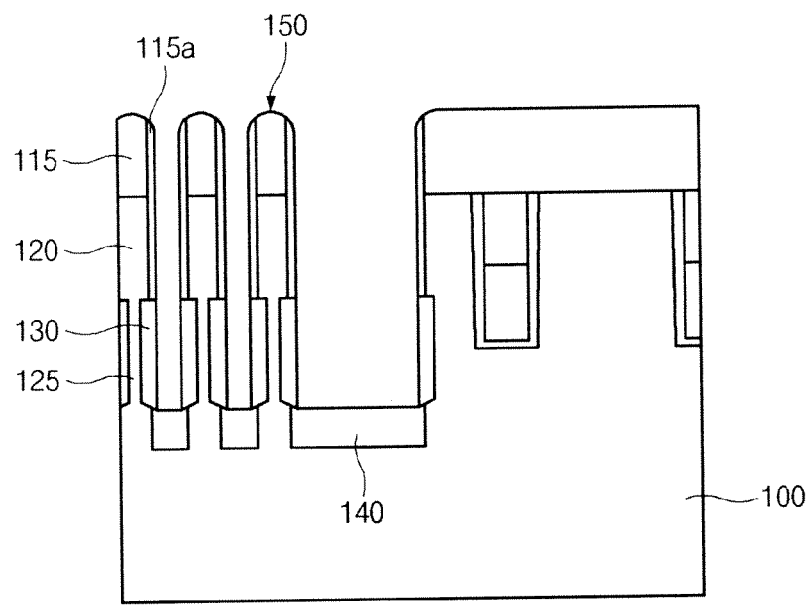

Referring to FIG. 2a, a hard mask layer (not shown) is formed over a semiconductor substrate 100. The hard mask layer (not shown) is patterned with a mask defining an active region where a vertical transistor is formed. The hard mask layer (not shown) preferably includes a film selected from the group consisting of an oxide film, an insulating film, and combinations thereof. A hard mask pattern 115 defining a vertical transistor region to be circular or polygonal is formed.

A part of the substrate 100 is etched with the hard mask pattern 115 as an etching mask to form a first vertical pillar 120 that defines an active region. The first vertical pillar 120 is used as a source/drain region. In case of DRAMS, the first vertical pillar 120 preferably is connected to a capacitor.

A first insulating film (not shown) is formed over the substrate 100 including the first vertical pillar 120 and the hard mask pattern 115. The first insulating film (not shown) is then dry-etched to form a spacer 115a at sidewalls of the first vertical pillar 120 and the hard mask pattern 115. The first insulating film (not shown) preferably includes a film selected from the group consisting of an oxide film, a nitride film, and combinations thereof. The spacer 115a has a thickness that may be suitably adjusted to obtain a desirable thickness of a gate insulating film and a surrounding gate electrode.

A portion of the substrate 100 exposed between the first vertical pillars 120 is selectively etched with the spacer 115a and the hard mask pattern 115 to form a second vertical pillar (not shown) extended to the bottom portion of the first vertical pillar 120. The selective etching process for forming a second vertical pillar preferably is performed by a dry etching method. The second vertical pillar (not shown) preferably has a height that may be adjusted based on the size of the surrounding gate electrode.

A sidewall of the second vertical pillar (not shown) is selectively etched to form a third vertical pillar 125 having a critical dimension (CD) that preferably is smaller than that of the first vertical pillar 120. The third vertical pillar 125 is used as a channel, and the etching process for forming the third vertical pillar 125 is performed by an isotropic etching method.

Impurity ions are implanted into the substrate 100 disposed between the third vertical pillar 125 and the top portion of the first vertical pillar 120 to form a source/drain region. A first bit line implant process is performed on the substrate 100 between the third vertical pillars 125 to form a first bit line implant region 140.

A gate insulating film is formed over the third vertical pillar 125. A conductive layer (not shown) is filled between the third vertical pillars 125. The conductive layer (not shown) is selectively etched with the spacer 115a and the hard mask pattern 115 as an etching mask to form a gate 130 that surrounds sidewalls of the third vertical pillar 125. The first bit line implant region 140 is formed in the substrate 100 disposed between the third vertical pillars 125.

A vertical pillar structure including the source/drain region formed in the surrounding gate 130 and the first vertical pillar 120 is referred to as a vertical transistor 150.

Figure 2B:
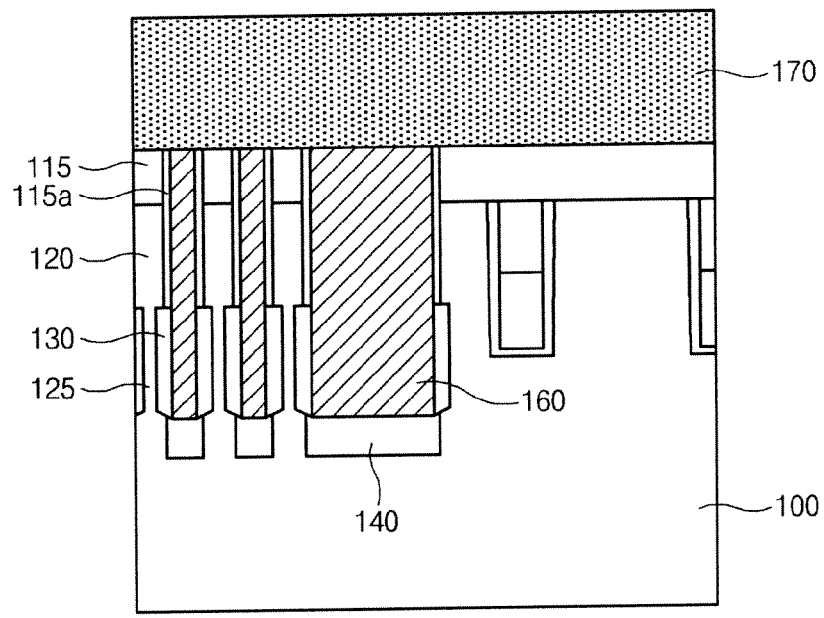

Referring to FIG. 2b, a spin-on-carbon (SOC) film 160 is formed over the substrate 100 for forming a bit line trench. The SOC film 160 has an excellent gap-fill characteristic like a spin-on-dielectric (SOD) film. Also, the SOC film 160 can be treated at temperature lower than 250° C., and may serve as a hard mask. The SOC film 160 minimizes the stress applied to the vertical transistor 150 and can thereby avoid collapsing the transistors. When the SOC film 160 is used, the surface does not become rough during a high temperature annealing process. As a result, a CMP process is not required.

A multi-functional hard mask layer 170 is formed over the vertical transistor 150 and the SOC film 160. The multi-functional hard mask layer 170 preferably uses Si-Bottom Anti-Reflectivity Coating (Si-BARC). When the Si-BARC is used, an anti-reflective film may not be formed.

Figure 2C:
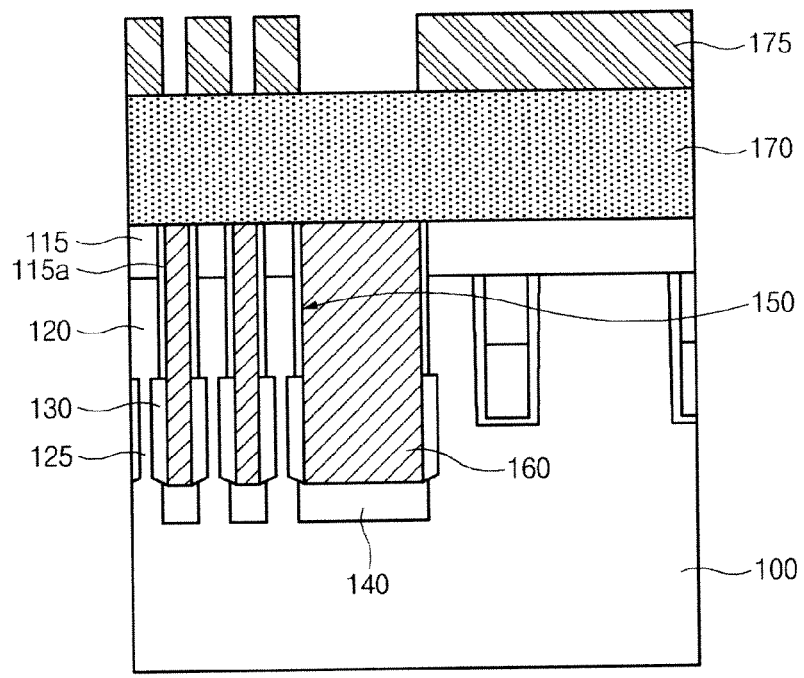

Referring to FIG. 2c, a photoresist pattern 175 is formed over the multi-functional hard mask layer 170. The photoresist pattern 175 exposes a region where a bit line trench is later formed. The bit line trench forming region is a region between the vertical transistors 150.

Figure 2D:
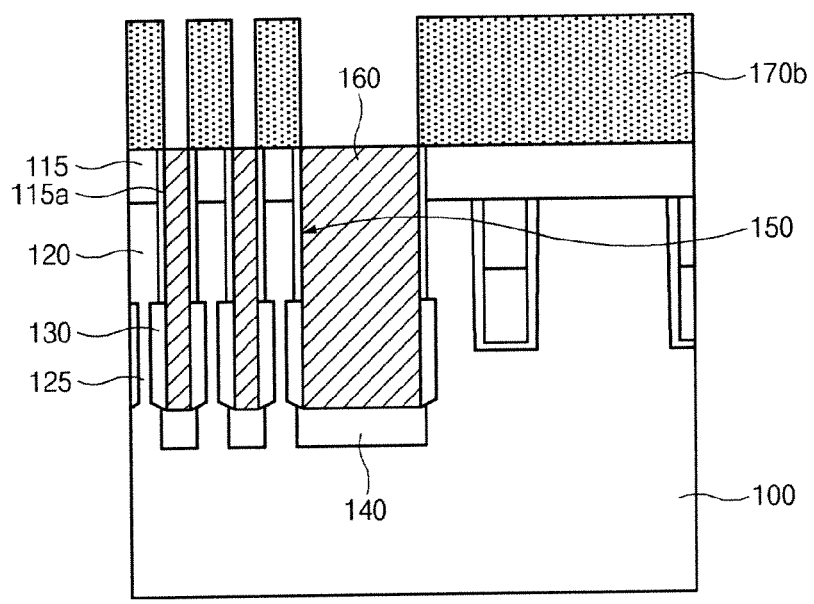

Referring to FIG. 2d, the multi-functional mask layer 170 is etched, with the photoresist pattern 175 as an etching mask, to form a multi-functional hard mask pattern 170b that exposes the bit line trench forming region. The multi-functional hard mask pattern 170b preferably is formed using plasma of $CF_4$ base. Thereafter the photoresist pattern 175 is removed.

The process for forming the SOC film 160 and the multi-functional hard mask pattern 170b does not require great environment change, so that the process can be performed in-situ, thereby simplifying the semiconductor manufacturing process.

Figure 2E:
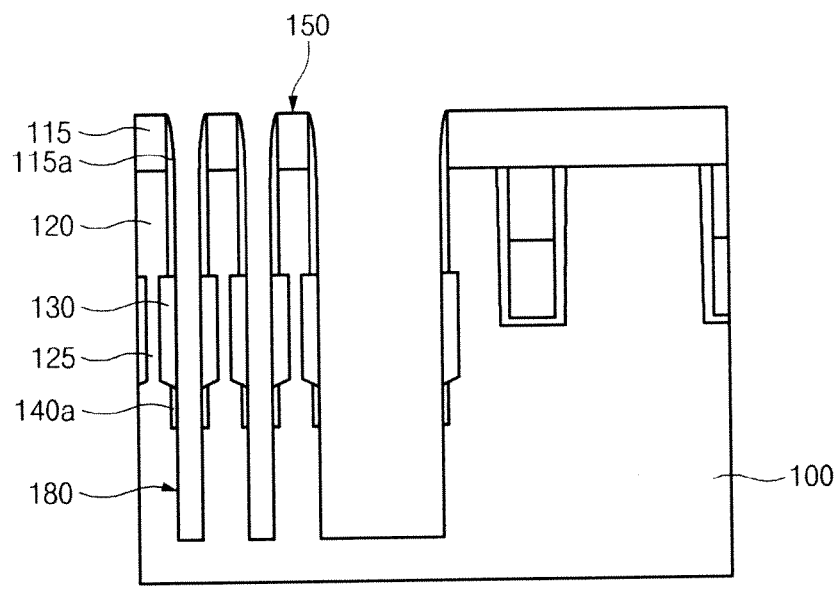

Referring to FIG. 2e, the SOC film 160 and the substrate 100 under the SOC film 160 are etched with the multi-functional hard mask pattern 170 to form a bit line trench 180. The process for etching the SOC film 160 preferably is performed using plasma of $O_2$ and $N_2$ base. The process for etching the substrate 100 preferably is performed using plasma of HBr and $Cl_2$ base.

The first bit line implant region 140 is divided by the bit line trench 180, which becomes a first bit line 140a. The multi-functional hard mask pattern 170b is removed.

Figure 2F:
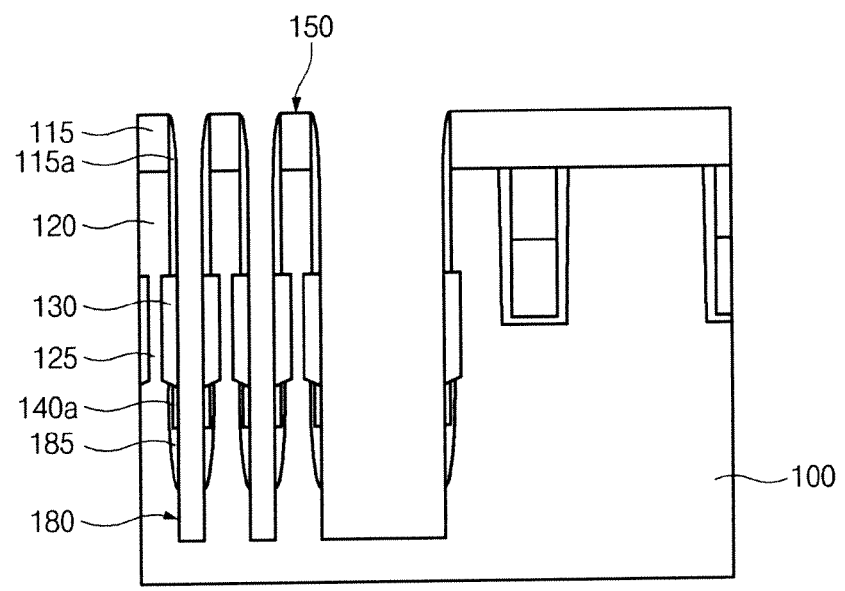

Referring to FIG. 2f, a second bit line implant process is performed on sidewalls of the bit line trench 180, with the residual SOC film (not shown) as an implant mask. The same implant process is performed to form a second bit line 185 in the bottom portion of the first bit line 140a. The residual SOC film (not shown) is removed. A process for filling the SOD film in the bit line trench 180 after forming the second bit line 185 is further performed.

As described above, according to an embodiment of the invention, a method for manufacturing a semiconductor device includes forming a SOC film that facilitates a low temperature baking process when forming a bit line trench of a vertical transistor. The SOC film has an excellent gap-fill characteristic. Also, the SOC film can be treated at a temperature of less than about 250° C., and may serve as a hard mask. As a result, the SOC film minimizes a stress imported to the vertical transistor, preventing collapse of the transistor, and prevents the film surface from becoming rough during a high temperature annealing process. Accordingly, a CMP process is not required, and the deposition number of hard mask patterns is reduced, thereby simplifying the process and improving yield of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed:

1. A method for manufacturing a semiconductor device, the method comprising:
    forming vertical transistors in a semiconductor substrate;
    forming a spin-on-carbon (SOC) film filling a gap between the vertical transistors over the semiconductor substrate;
    forming a hard mask pattern over the semiconductor substrate, including over the vertical transistors and the SOC film;
    baking the SOC film to make a surface of the SOC film smooth without a Chemical Mechanical Polishing (CMP) process;
    etching the SOC film and the semiconductor substrate under the SOC film with the hard mask pattern as a mask to form a bit line trench, wherein a residual SOC film remains on at least a portion of the bit line trench;
    removing the hard mask pattern; and
    performing an implant process to form a bit line in a portion of the substrate where the bit line trench contacts the vertical transistors using the residual SOC film as an implant mask.

2. The method according to claim 1, wherein the step of forming vertical transistors includes:
    forming a mask pattern, defining an active region, over the semiconductor substrate;
    etching a portion of the substrate with the mask pattern as an etching mask to form a first pillar;
    forming a spacer at sidewalls of the mask pattern and the first pillar;
    etching the substrate exposed between the first pillars, with the spacer and the mask pattern as an etching mask, to form a second pillar;
    selectively etching the second pillar to form a third pillar;
    removing the spacer and the mask pattern;
    implanting impurities into the substrate disposed between the third pillar and a top portion of the first pillar to form a source/drain region;
    forming a first bit line implant region in the semiconductor substrate disposed between the third pillars; and
    forming a surrounding gate outside the third pillar.

3. The method according to claim 2, wherein the second pillar is formed where the first pillar is extended.

4. The method according to claim 2, wherein the mask pattern comprises a film selected from the group consisting of an oxide film, a nitride film, and combinations thereof.

5. The method according to claim 2, wherein the surrounding gate comprises a gate insulating film and a conductive film.

6. The method according to claim 1, comprising baking the SOC film at a temperature of about 200° C. to about 250° C.

7. The method according to claim 1, wherein the hard mask pattern is a Si-Bottom Anti-Reflectivity Coating (BARC).

8. The method according to claim 7, wherein the SOC film and the Si-Bottom Anti-Reflectivity Coating (BARC) are formed in-situ.

9. The method according to claim 7, wherein the Si-Bottom Anti-Reflectivity Coating (BARC) is formed with a plasma of $CF_4$ base.

10. The method according to claim 1, wherein the step of etching the SOC film step comprises etching with a plasma of $O_2$ and $N_2$ base.

11. The method according to claim 1, wherein the bit line trench is formed by etching the substrate with a plasma of HBr and $Cl_2$ base.

12. The method according to claim 1, further comprising removing the residual SOC film after performing the implant process.

13. The method according to claim 1, further comprising filling a spin-on-dielectric (SOD) film in the bit line trench after forming the bit line.

* * * * *